United States Patent [19]

Horwitz

[11] Patent Number: 5,047,971

[45] Date of Patent: Sep. 10, 1991

[54] CIRCUIT SIMULATION

[75] Inventor: Lawrence B. Horwitz, Danville, Calif.

[73] Assignee: Intergraph Corporation, Huntsville, Ala.

[21] Appl. No.: 394,232

[22] Filed: Aug. 15, 1989

Related U.S. Application Data

[63] Continuation of Ser. No. 65,454, Jun. 23, 1987, abandoned.

[51] Int. Cl.⁵ ............... G06G 7/62; G06G 7/48; G01R 31/28
[52] U.S. Cl. ............................ 364/578; 364/488; 371/23; 324/73 AT
[58] Field of Search ............. 364/488, 489, 490, 578, 364/579, 580; 371/23, 20; 324/73 AT

[56] References Cited

U.S. PATENT DOCUMENTS

| | | | |
|---|---|---|---|
| T940,013 | 9/1974 | Ho | 364/489 |
| 2,776,405 | 5/1953 | Moore et al. | 364/489 |
| 3,622,762 | 11/1971 | Dyer et al. | 364/489 |
| 3,702,003 | 10/1972 | Ramirez et al. | 364/489 |
| 4,293,916 | 10/1981 | Del Re et al. | 364/571 |
| 4,326,263 | 4/1982 | Given et al. | 364/300 |
| 4,467,275 | 8/1984 | Maeda et al. | 324/73 AT |
| 4,527,249 | 7/1985 | Van Brunt | 371/23 |
| 4,583,223 | 4/1986 | Inoue et al. | 371/20 |
| 4,641,348 | 2/1987 | Neuder et al. | 324/73 AT |
| 4,644,487 | 2/1987 | Smith | 364/578 |
| 4,646,299 | 2/1987 | Schinabeck et al. | 371/20 |
| 4,675,673 | 6/1987 | Oliver | 371/20 |
| 4,694,411 | 9/1987 | Burrows | 364/578 |
| 4,697,241 | 9/1987 | Lavi | 364/488 |
| 4,727,317 | 2/1988 | Oliver | 371/20 |
| 4,744,084 | 5/1988 | Beck et al. | 364/578 |

OTHER PUBLICATIONS

"Combined Multi-Corner Testing with Time and/or Voltage Modulation", R. J. Prilik, IBM Tech. Discl. Bull., vol. 24, No. 3, Aug. 1981, pp. 1677–1679.

Primary Examiner—Parshotam S. Lall
Assistant Examiner—V. N. Trans
Attorney, Agent, or Firm—Cushman, Darby & Cushman

[57] ABSTRACT

A method of simulating the operation of a circuit utilizing voltage or current data obtained from measurements of actual samples of each of the circuit components. The actually measured voltage or current data is employed to mathematically analyze operation of the circuit. In this process, each circuit component is characterized as one or more of a voltage controlled voltage source, voltage controlled current source, current controlled voltage source and current controlled current source. After such characterization, a trial operating point is selected and values of current or voltage between actually measured data points are determined and linearized circuit equations are established with spline equations. The linearized equations are solved. The steps are repeated with a new trial operating point in accordance with a Newton-Rhapson iterative technique until the solution of the linearized equations is within a predetermined range.

24 Claims, 15 Drawing Sheets

CIRCUIT SIMULATION

This is a continuation of application Ser. No. 07/065,454, filed June 23, 1987, which was abandoned.

BACKGROUND OF THE INVENTION

1. Field of the Invention

This invention relates to electronic circuit simulation, and more particularly to analog circuit simulators.

2. Description of the Prior Art

The design of analog circuitry has always been a challenging task in view of the interaction between circuit components. The operation of circuit components depends quite strongly upon the range of values of control variables applied to the device. For example, depending upon the manner in which a bipolar junction transistor (BJT) is biased, the BJT will operate in a saturated mode or a non-saturated mode. Even in the non-saturated mode, the BJT performance varies quite significantly. Variations in BJT performance will, in turn, affect the manner in which biasing components interact with the BJT, also altering the performance of the BJT.

The simplicity of interconnecting a circuit during the design phase and energizing it while its performance is monitored has a strong appeal. However, the simplicity is deceiving. Should the performance of the circuit not meet expectations, it is often difficult to reliably predict how a circuit should be modified so that the desired performance will be achieved. Furthermore, by simply energizing a circuit, an operator runs the risk of exceeding current and/or voltage tolerances for the components of the circuit, creating the potential that components will be destroyed.

To help circuit designers predict more reliably the performance of circuits they are designing, circuit simulators have been created. Such simulators typically employ equations to represent operating characteristics of components. A well known example is the circuit simulation program SPICE. SPICE operates by employing equations which attempt to mathematically define the operation of circuit components. A fundamental problem with the use of equations to represent components is that typically, the operation of components cannot be defined by simple equations. Many circuit components operate through the interaction of a number of physical principles which all must be taken into consideration when mathematically describing the operation of a component. This creates a trade-off which must be resolved. To achieve a high degree of accuracy, complex equations must be employed which are difficult to work with. However, simplified equations produce inaccurate results.

Examples of known circuit simulators are described in the following U.S. Pat. No.: 4,527,249 which describes a logic circuit simulator, U.S. Pat. No. 4,215,420 which describes a parity simulator, U.S. Pat. No. 3,702,003 which describes an algorithm to minimize iterative computation of a system such as electronic circuits and U.S. Pat. No. 4,293,916 which describes apparatus for simulating thermocouples to calibrate or adjust apparatus which employs the output from thermocouples. The '916 patent does suggest that characteristic curves of the thermocouples may be stored and employed to simulate the output of the thermal couples. However, nowhere in this patent is there any suggestion of how an analog circuit simulation might advantageously employ characteristic curves to accurately analyze the operation of the circuit.

SUMMARY OF THE INVENTION

The present invention provides a circuit simulation technique which achieves high accuracy without undue complexity. To achieve these seemingly contradictory goals, instead of defining the operation of circuit components with mathematical equations as in the prior art, the present invention employs measurements of characterizing values, such as current or voltage, made on actual samples of the circuit components. Once the measurements of actual components has occurred, all that is necessary is to establish interconnections between the circuit components to form the circuit being simulated and to use the measured data to mathematically analyze operation of the circuit. As a result, circuit simulation is possible with an accuracy enhanced by a more accurate representation of the circuit component.

Any circuit component may be considered as an interconnected group of basic elements selected from the group consisting of a voltage controlled voltage source, a voltage controlled to current source, a current controlled voltage source and a current controlled current source. After a circuit component has been so characterized, characteristic data is obtained for the sources corresponding to each component from actual samples of each circuit component. After establishing the interconnection of the circuit components, a trial operating point may be selected and the actual measured data may be linearized around the operating point. Linearized circuit equations may then be created and solved. This process may be performed iteratively using, for example, Newton-Rhapson algorithm, until the solution is within a predetermined range.

Spline functions may be utilized to interpolate between data values actually measured and to create a linearized approximation of the data.

With such an arrangement, circuits may be simulated in a comparatively simple fashion.

BRIEF DESCRIPTION OF THE DRAWINGS

These and other objects and advantages of this invention will become more apparent and more readily appreciated from the following detailed description of the presently preferred exemplary embodiment, taken in conjunction with the accompanying drawings, of which.

DETAILED DESCRIPTION OF THE PRESENTLY PREFERRED EXEMPLARY EMBODIMENTS

Figure 1:
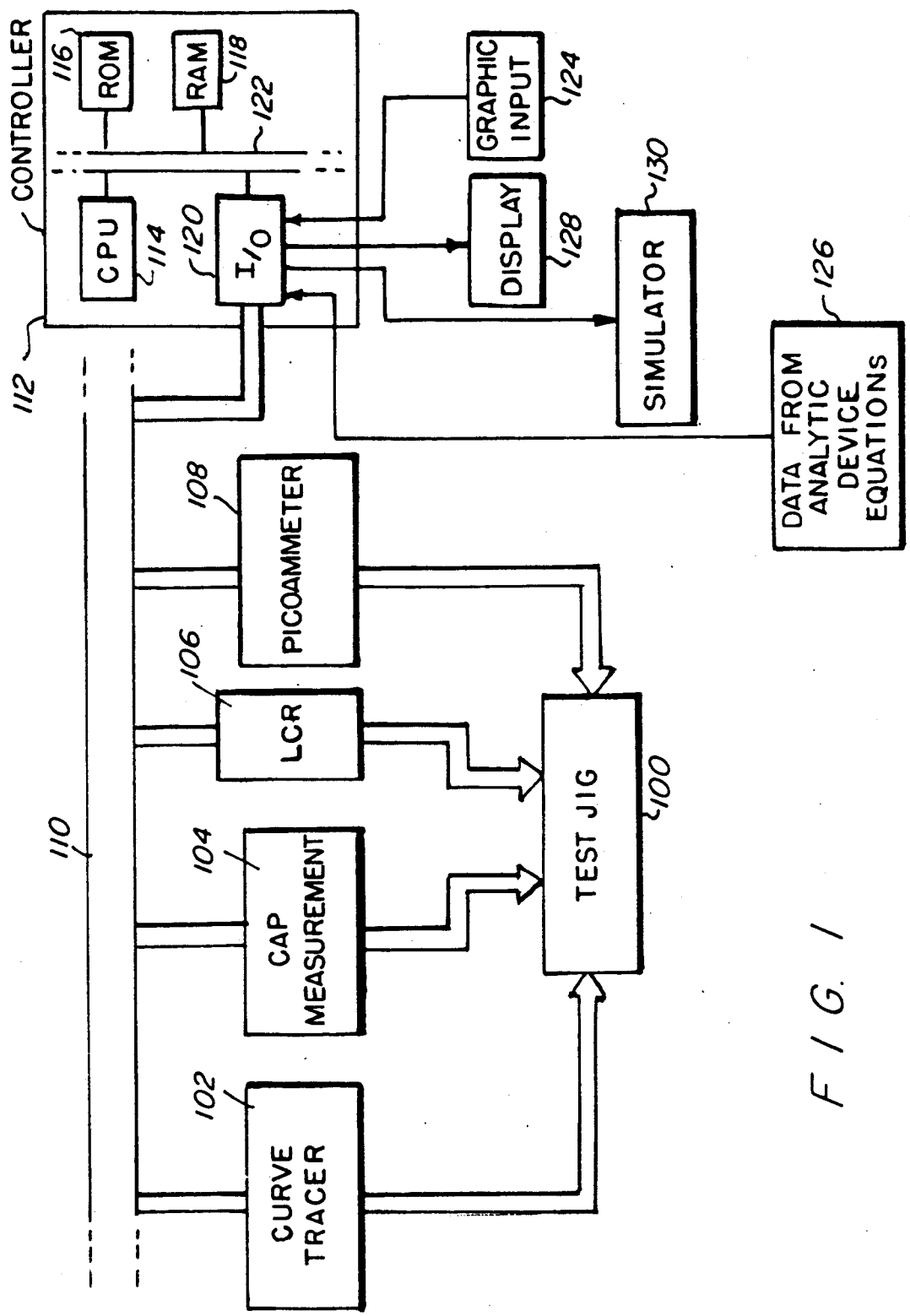
FIG. 1 is a block diagram of the apparatus for collecting data and performing the circuit simulation in the present invention.

According to the present invention, all components that might be employed in a circuit may be considered as combinations of four basic elements, a voltage controlled current source, a current controlled voltage source, a voltage controlled voltage source and a current controlled current source. For example, a BJT may be considered as two voltage controlled current sources with a commonly connected output representing the emitter, the input to one of the voltage controlled current sources being the base and the input to the other of the voltage controlled current sources being the collector. A resistor, a capacitor or a diode may be considered as a voltage controlled current source, albeit with different operating characteristics. An inductor may be considered a current controlled voltage source. A field effect transistor may be considered as two connected voltage controlled current sources. An operational amplifier may be considered as either a voltage controlled current source or a voltage controlled voltage source. Those of ordinary skill in the art have an intuitive feel for which of these four types of sources would best characterize any particular device and, in fact, the same device may be characterized by different combinations of such sources with accurate simulations still produced. Those of ordinary skill in the art will realize that BJT's, diodes, operational amplifiers and field effect transistors are examples of active components.

A voltage controlled current source produces a current, of course. The current may be considered to have a term which is a function of various voltage differences occurring across different points of the component being simulated additively combined with a second term which is a derivative of charge with respect to time. Charge, itself, is a function of various voltages occurring at different points of the component being simulated.

A current controlled voltage source obviously produces a voltage. This voltage has a first term which is a function of various currents flowing through different portions of the component being simulated additively combined with a second term which is a derivative of flux with respect to time. Flux, itself, is a function of the various currents flowing through different portions of the simulated component.

A voltage controlled voltage source produces a voltage which is a function of various voltages occurring across various points in the device being simulated while a current controlled current source produces a current which is a function of the various currents flowing through different portions of the device.

Prior simulators have employed mathematical equations to define the various functions referred to above. The present invention is different, however, in that actual measurements are taken to determine these functions. Thus, various voltages and/or currents are applied to the component being tested with currents, voltages, capacitances and/or inductances being measured. By collecting such data for a large number of different voltages and currents applied to the component, a very accurate representation of the operating characteristics of the component models may be generated.

The equipment of FIG. 1 may be employed to collect such data. Any component to be tested is placed in test jig 100. Voltages are then applied to terminals of the component and currents are measured, or currents are applied to the terminals of the component and voltages are measured. To accomplish such testing, curve tracer 102, capacitance measuring device 104, inductance, capacitance, resistance measuring device 106 and/or picoammeter 108 may all be connected to test jig 100. Curve tracer 102 may, for example, be the HP4145 manufactured by Hewlett-Packard. Capacitance measuring device 104 may be the HP4280 also manufactured by Hewlett-Packard. In fact, Hewlett-Packard markets an entire system for automatically collecting such data. In such a system, measuring devices 102-108 are connected to a bus 110, which Hewlett-Packard refers to as the HP-IB bus which, in turn, is connected to controller 112. Controller 112 includes a central processing unit 114, read only memory 116, random access memory 118 and input/output buffer 120 all connected to an internal bus 122. Read only memory 116 contains a program which automatically causes voltages and/or currents to be applied to the component being tested in test jig 100 and, at the same time, takes programmed measurements from the appropriate terminals of the component in test jig 100 using measuring devices 102-108. In addition, controller 112 may also accept data from graphic input unit 124 which provides surfaces describing the operating characteristics of a circuit component. Input device 126 may be employed to input analytic device equations such as equations employed in prior art circuit simulators if so desired. The collection of data may be made interactive through the provision of display 128. In the end, the data collected by the system may be output to simulator 130 which includes a computer.

Figure 2A:
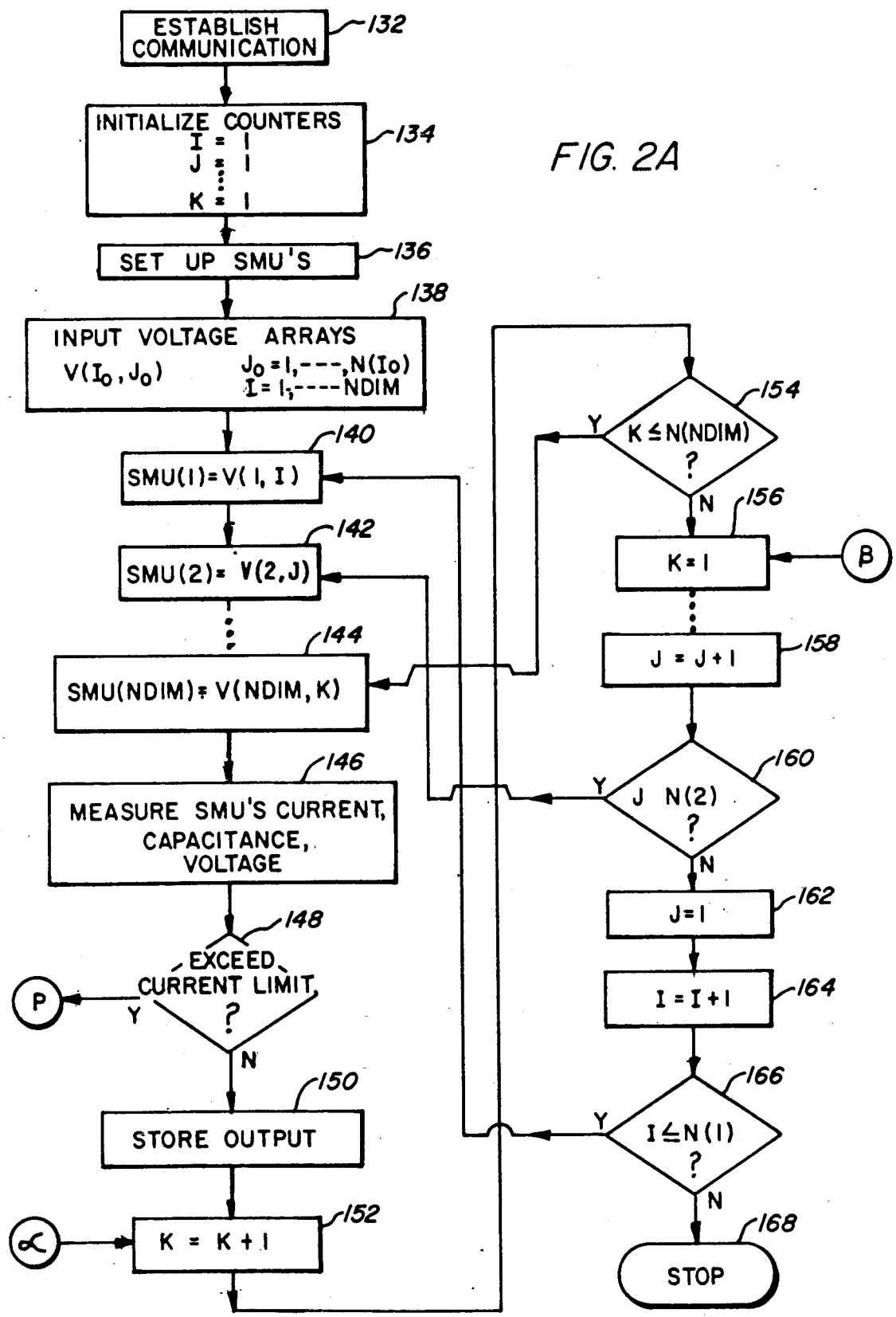
FIGS. 2A and 2B are a flow diagram of the controller which collects circuit component data.
Figure 2B:
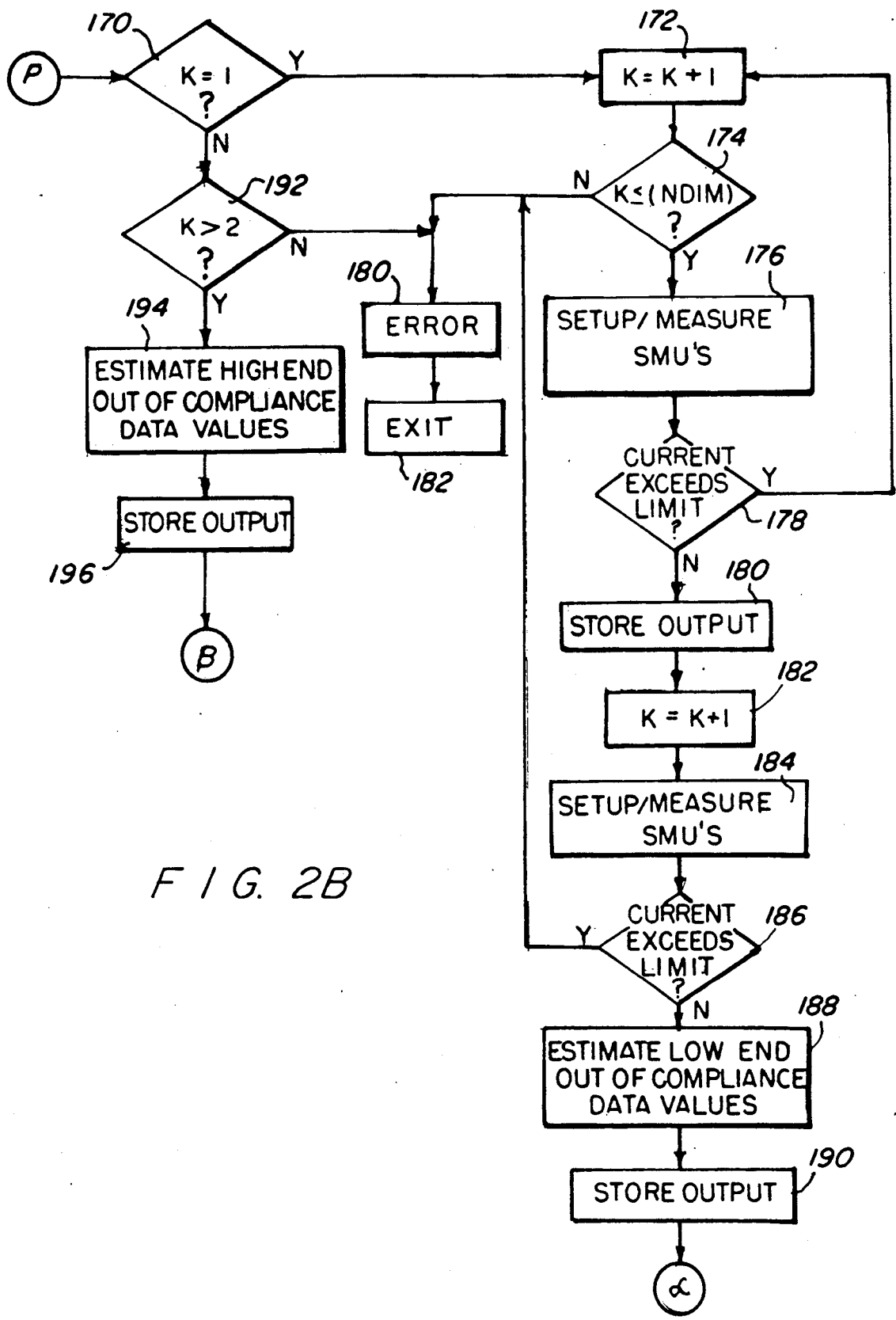

A flow diagram of the operation of controller 112 is illustrated in FIGS. 2A and 2B. With the apparatus employed in the preferred embodiment, each connection to a terminal of the component being tested is referred to as a source measurement unit (SMU). Each SMU may apply a voltage or a current to a terminal of the component being tested and/or may be connected to any one of testing devices 102-108 so that a measurement can be made.

After controller 112 establishes communication with test jig 100 and testing devices 102-108 at step 132 in FIG. 2A, counters, I, J . . . K, one associated with each SMU, are initialized at step 134. At step 136, all of the SMU's are set up in the sense that they are tested to be certain that they are working, that they are zeroed and that they are calibrated.

At step 138, voltage arrays are inputted which control the voltages that are applied to the various terminals during testing. The voltage arrays take the form of $V(I_0, J_0)$ $I_0$ can take any value between 1 and NDIM and each value refers to a particular terminal or SMU. Thus, when $I_0$ is 1, a voltage is being referred to which is or will be applied to the first SMU. The total number of terminals or SMU's is NDIM. The variable $J_0$ represents a numbering of the possible voltage values to be applied to terminal $I_0$. The variable $J_0$ can range from 1 to $N(I_0)$. Thus, when $J_0$ is 1, it is referring to the first voltage to be applied to the $I_0$ terminal and when $J_0$ is $N(I_0)$, it is referring to the last voltage to be applied to terminal $I_0$. Thus, $V(1,1)$ represents the first voltage to be applied to the first SMU. $V(NDIM, N(NDIM))$ refers to the last voltage to be applied to the last SMU.

As a result of steps 140-144, the first voltage in the voltage array is set to be applied to each of SMU's 1 through NDIM. Step 146 causes currents, voltages and/or capacitances to be measured. Of course, for devices represented by current controlled sources, steps 140-146 would cause currents to be applied and voltages, currents and/or inductances to be measured.

Step 148 checks to be certain that the voltages being applied to the component do not result in currents exceeding limits for that device. Of course, excessive voltages and currents can destroy components. The input voltage arrays are selected to avoid excessive voltages. However, care must be taken that such voltages do not produce excessive currents and this is monitored at step 148. If current limits are not exceeded, the current values are stored in step 150. The counter for the voltage values of the last SMU is incremented in step 152 and step 154 causes the program to loop through steps 144 through 155 until each voltage of the input array for the last SMU has been applied. Then, at step 156, the counter for the last SMU is returned to 1 and the next to last SMU receives its second voltage. Eventually, even the second SMU has its voltages incremented at steps 158 and 160. Finally, the first SMU is incremented through its appropriate voltages at steps 162, 164 and 166. In this manner, every conceivable combination of permissible voltages is systematically applied to the SMU's. Once this process has finished, the data collection process stops at step 168.

It should be noted that the definitions of the various sources included terms of charge and flux. However, it is difficult to measure charge and flux directly. Instead, step 146 measures capacitance and inductance. The capacitance and inductance measurements may then be integrated in a conventional manner to establish charge and flux data as a function of voltage.

If step 148 determines that any particular combination of voltages produces an excessive current, processing proceeds to step 170 in FIG. 2B. At step 170 it is determined whether the first voltage in that particular series of incrementations of the voltage of the last SMU resulted in the excessive current. If so, the counter for the last SMU is incremented at step 172 and at step 174 it is determined whether the last voltage for the last SMU has already been processed. If not, measurements are taken at step 176 and step 178 again determines whether any currents are exceeded. If currents are exceeded, then steps 172 through 178 are repeated until step 178 determines that current limits have not been exceeded. If step 178 determines that current limits are always exceeded through the last voltage value as determined by step 174, step 180 causes an error indication to be generated and the data collecting routine is stopped at step 182.

Should step 178 determine that incrementation of counter K eventually produces currents which are within limits, it means that the low voltages produced currents out of limits but higher voltages produce currents within the limits. The current measurements of the acceptable data are stored at step 180 and the counter K is incremented at step 182. Then, step 184 causes voltages to be applied and currents measured. Step 186 again determines whether limits are exceeded. If limits are not exceeded, then two sets of measurements have been taken where current limits have not been exceeded. These two sets of measurements are employed at step 188 to extrapolate current values for the low voltages which previously caused current limits to be exceeded. These extrapolated values are stored at step 190 and processing returns to step 152 in FIG. 2A for further incrementation of the counter K.

Should step 186 determine that the current limits have again been exceeded, it means that the currents have moved from exceeding limits to being within limits (as determined at step 178) and then again to exceeding current limits. This can only occur if the device exhibits negative resistance characteristics. With the particular extrapolation algorithm illustrated in FIG. 2B, negative resistances cannot easily be accommodated. Accordingly, if the determination at step 186 should be positive, an error indication is generated at step 180 and the data collection process terminates at step 182, which allows an operator to collect further data in a more manual fashion.

If step 170 determines that it was not the first voltage of the last SMU that caused the current limits to be exceeded, step 192 determines whether it was the second voltage. If it was the second voltage, then the determination at step 192 is negative. Therefore, the first voltage produced currents within limits but the second voltage did not. This does not provide enough data for extrapolation so that an error indication is generated at step 180 and the program exits at step 182.

Should step 192 produce a positive result, then the voltage value producing excessive currents was at least the third voltage value. Therefore, step 194 is able to extrapolate current values for higher voltages from the last voltages within range. Step 196 causes these estimated values to be stored and processing returns to step 156 in FIG. 2A for incrementation of the voltage of the second to last SMU.

In this manner, all necessary data of current, capacitance and inductance versus voltage can be obtained for the sample component, which data may then be used to simulate the operation of that component in a circuit.

The circuit simulator of the present invention is capable of performing various analyses including DC operating point analysis, DC operating characteristics or DC sweep in which DC supply voltages are allowed to vary over a range, transient analysis in which the response of a circuit is monitored over a time in response to a particular set of input signals and AC analysis. As is well known to those of ordinary skill in the art, all four of these various analyses can be cast as solving non-linear equations which all look like DC equations.

Figure 3:
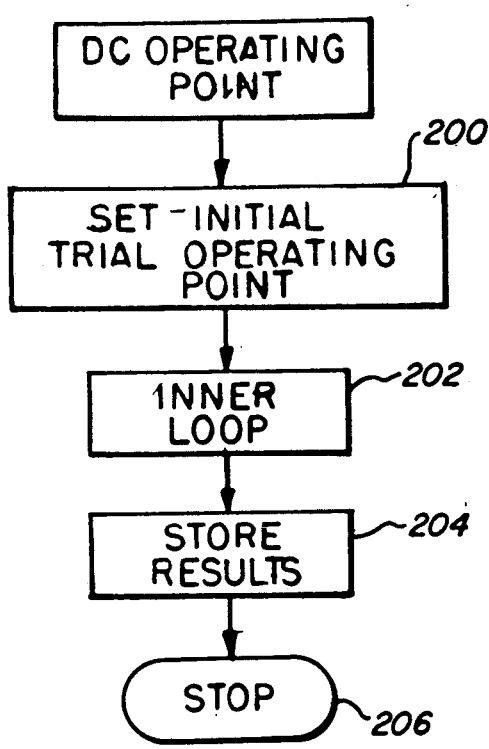
FIG. 3 is a flow diagram of a simulator according to the present invention analyzing DC operating point.

FIG. 3 illustrates the processing performed by the preferred embodiment of the circuit simulator when determining a DC operating point. Although those of ordinary skill in the art know of numerous possibilities for establishing the operating point of a circuit, the present invention employs the Newton-Rhapson iterative technique to solve the inherently non-linear circuit equation, which technique requires the linearization of the equations. As those of ordinary skill in the art well know, this technique begins by selecting a trial operating point at step 200. Then, an inner loop routine is performed at step 202 to refine the initial trial operating point and determine the actual operating point. At step 204, the operating point results are stored and the simulation ends at step 206.

Figure 4:
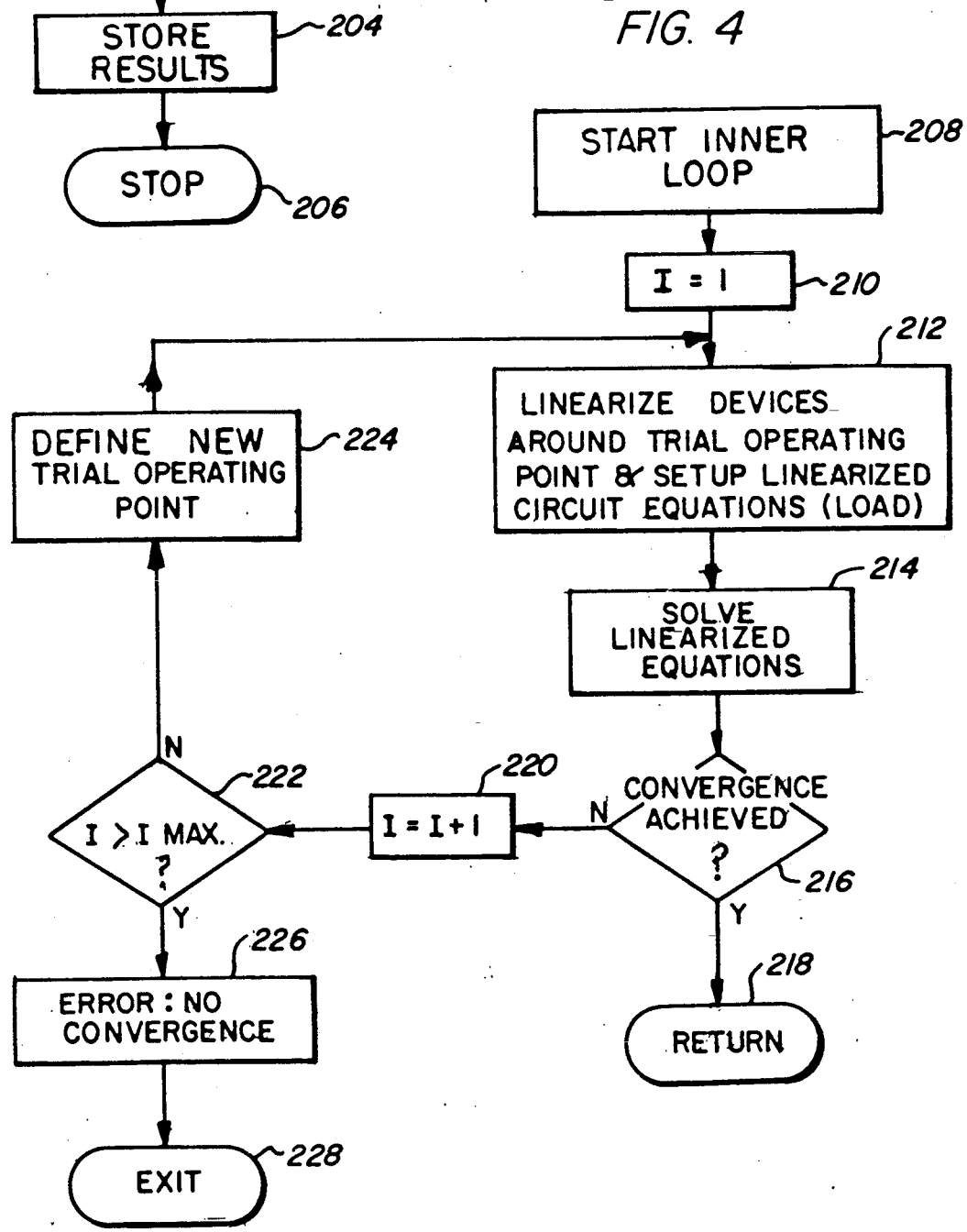
FIG. 4 is a flow diagram an inner loop subroutine of a simulator according to the present invention for identifying an actual operating point.

FIG. 4 illustrates the inner loop routine. After the routine starts at step 208, a counter I is initialized to one at step 210. At step 212, measured data is used to establish the trial operating point and linearized circuit equations are determined in accordance with the equations for the four types of sources discussed above. The details of the manner of interpolating the data around the trial operating point and linearizing the circuit equation will be described in detail below with respect to FIGS. 7 through 16. Those of ordinary skill in the art will appreciate that many alternative techniques are available and may be used with this invention.

At step 214, the linearized equations are solved and at step 216 it is determined whether the solution is within a predetermined range of the proper answer. If the solution is within the predetermined range, the actual operating point has been determined and the inner loop ends at step 218.

Should the trial operating point not produce the desired solution as determined at step 216, the counter I is incremented at step 220 and is compared with a maximum value at step 222. As long as that counter is below the maximum value, a new trial operating point is defined at step 224 and step 212 again linearizes the data from the devices around the new trial operating point and sets up linearized circuit equations.

With some circuits, it is impossible to reach the desired solution by altering trial operating points. If step 222 determines that a certain number of iterations have occurred without reaching convergence as determined by step 216, a no convergence error message is generated at step 226 and the inner loop ends at step 228.

Figure 5:
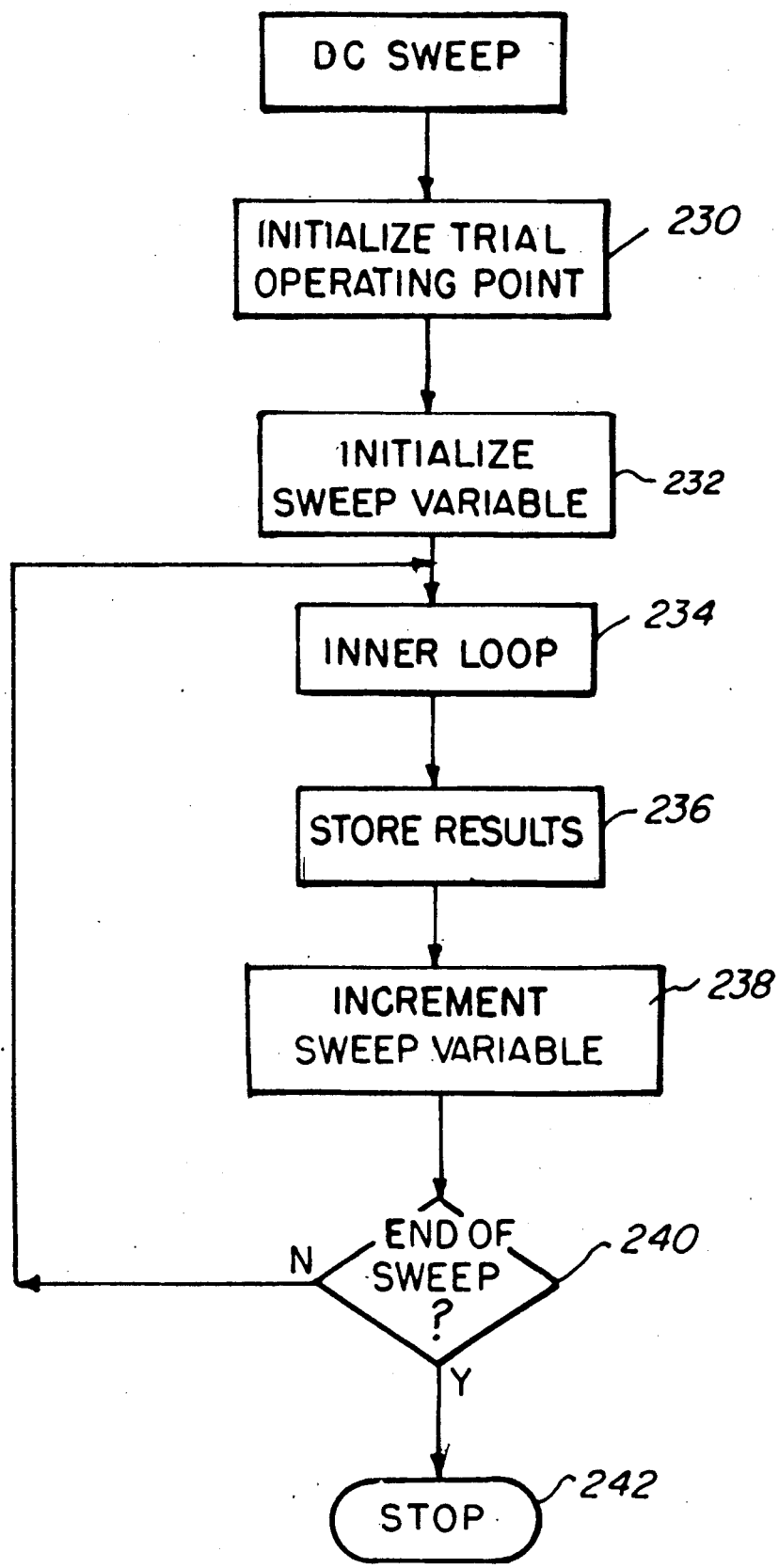
FIG. 5 is a flow diagram of a simulator according to the present invention analyzing DC sweep.

FIG. 5 illustrates the steps taken by the simulator of the preferred embodiment to perform a DC sweep analysis. An initial trial operating point is set at step 230 and an initial sweep variable is set at 232. Then, at step 234, the inner loop of FIG. 4 is performed to determine the actual operating point for the particular value of the sweep variable. The results are stored at step 236 and the sweep variable is incremented at step 238.

Step 240 determines whether operating points have been calculated for all values of the sweep variable. If not, steps 234 through 240 are repeated. Once the circuit has been analyzed for values of the sweep variable, the simulator stops at step 242.

Figure 6:
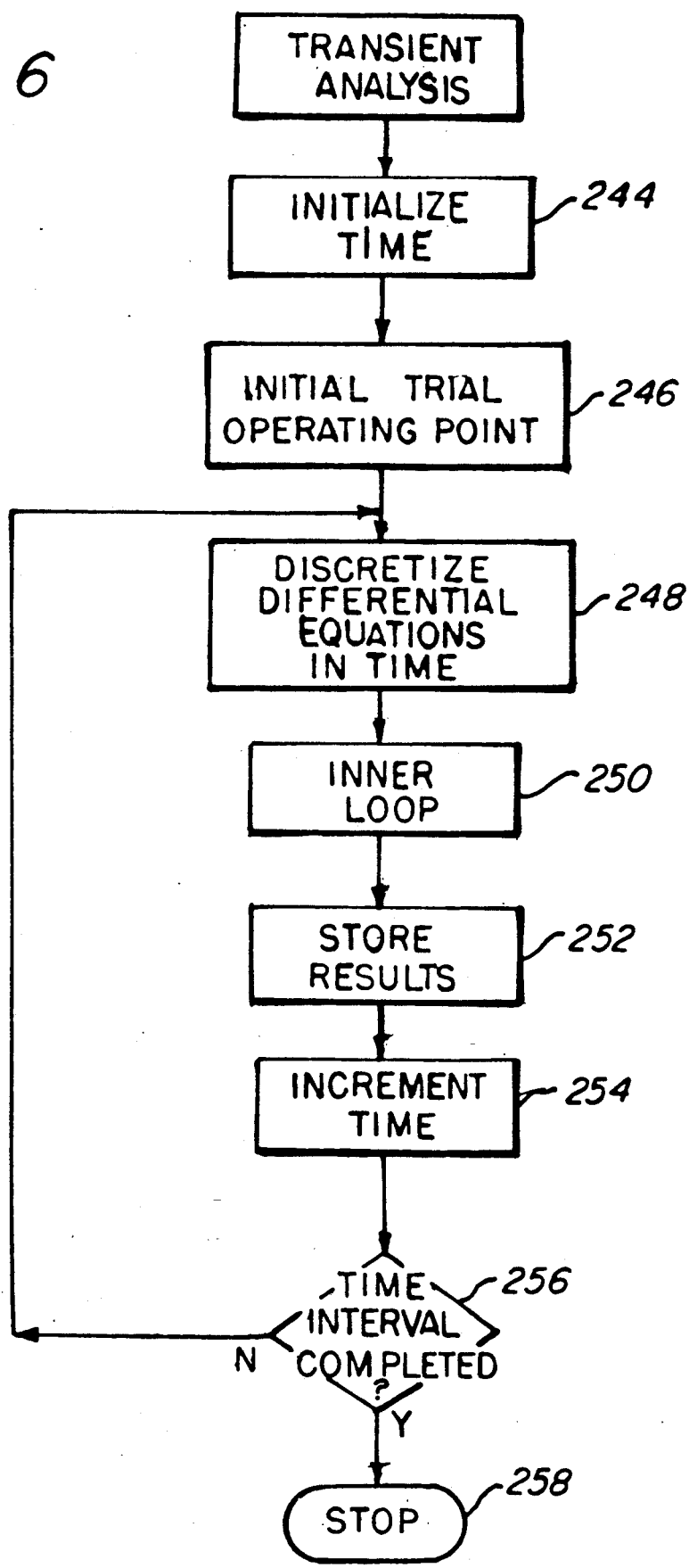
FIG. 6 is a flow diagram according to the present invention performing a transient analysis.

FIG. 6 illustrates the operation of the preferred embodiment during a transient analysis. At step 244, the time over which the analysis will be computed is initialized and at step 246, an initial trial operating point is selected. At step 248, differential equations that describe the operation of the circuit over time are discretized in time and at step 250, the inner loop illustrated in FIG. 4 is performed at the initial time. After the inner loop has been performed, the results are stored at step 252 and the time value is incremented at step 254. Step 256 determines whether the entire time interval has been analyzed. If not, steps 248 through 256 are repeated. Once step 256 determines that the entire time interval has been analyzed, the processing stops at step 258.

In accordance with of the preferred embodiment, an AC analysis may be performed by running the transient analysis of FIG. 6 for a particular AC source. Then, a spectrum analysis is performed on the result of the transient analysis to determine the frequency response of the circuit.

Attention is directed to step 212 of FIG. 4 illustrating the inner loop. The manner in which data from circuit components are linearized around the trial operating point will be described with respect to FIGS. 7 through 16.

Figure 7:
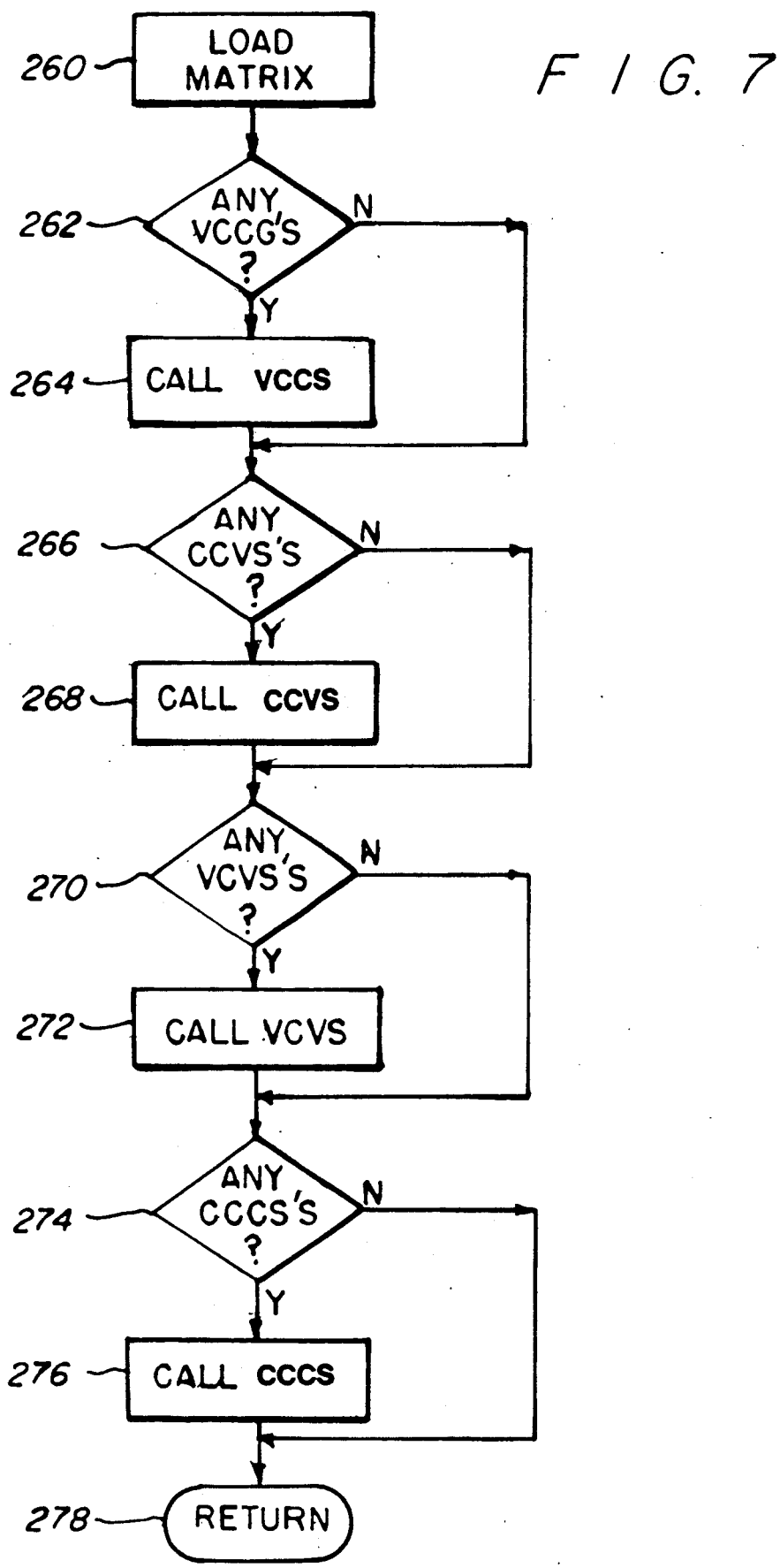
FIGS. 7-11 are a flow diagram illustrating the manner in which measured data is loaded in a matrix for each of a voltage controlled current source, current controlled voltage source, voltage controlled voltage source and current controlled current source.

When a circuit to be simulated is loaded into the simulator, a list of all the sources employed to simulate components in the circuit is stored. Then it is necessary to obtain measured characteristic data for each of the sources employed in the simulation around the trial operating point being calculated. This data is loaded into a matrix which is employed to set up the linearized circuit equations. FIG. 7 illustrates the manner in which this data is obtained. After beginning the loading routine at step 260, the simulator determines at step 262 whether any voltage controlled current sources (VCCS's) are found in the circuit being simulated. If so, step 264 calls a VCCS subroutine which processes data from all of the voltage controlled current sources. Steps 266 and 268 perform the same function for current controlled voltage sources (CCVS's), steps 270 and 272 perform the same processing for voltage controlled voltage sources (VCVS's) and steps 274 and 276 perform the same processing for current controlled current sources (CCCS's). After all four types of sources have been processed, processing returns at step 278 to step 212 in FIG. 4 so that linearized equations can be set up.

Figure 8:
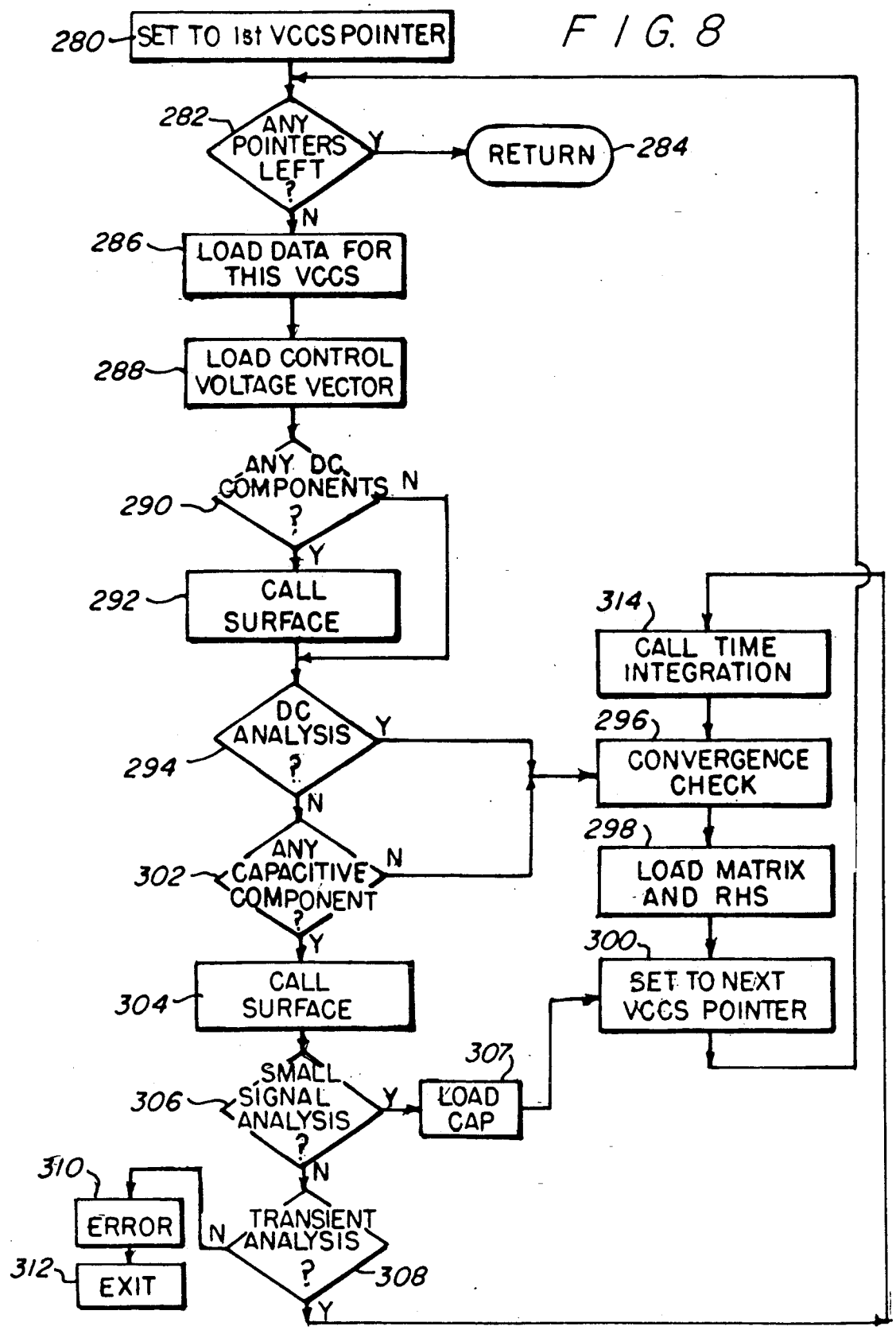

FIG. 8 shows the VCCS subroutine called in step 264 of FIG. 7. Step 280 of the VCCS subroutine begins by obtaining the identity of the first voltage controlled current source in the list of sources making up the circuit to be analyzed. If step 282 determines that there are no VCCS's or no more VCCS's, the subroutine returns at step 284 to step 266 in FIG. 7.

Assuming that another VCCS must be processed, step 286 causes the raw data that was collected in accordance with testing procedure of FIGS. 2A and 2B to be loaded for the particular VCCS being processed. At step 288, the control voltage vector is loaded for the particular VCCS and the particular operating point being evaluated. The term "operating point" actually refers to values of voltages, for example, at various nodes throughout the circuit being simulated. These control voltages define the point at which the particular VCCS is being operated. The remainder of the VCCS subroutine of FIG. 8 simply determines what the particular VCCS will output in response to the various input conditions set in the control voltage vector. To accomplish this analysis, it is typically necessary to interpolate for data values between voltages for which measurements were actually taken in accordance with FIGS. 2A and 2B. Although those of ordinary skill in the art will be able to use any of a large number of interpolation techniques with the present invention, the preferred embodiment of the present invention employs spline functions to perform interpolation. More specifically, the preferred embodiment employs B-spline functions. These functions are not new and those of ordinary skill in the art have been employing such functions to perform interpolations for a number of years. Therefore, only a cursory review of how such functions might be employed in the present invention will be provided.

Those of ordinary skill in the art realize that a spline analysis employs a knot array which provides reference points at particular values of the control variable through which the particular curve must pass. When forming the curve with the B-spline function, segments of a polynominal, typically, of order $(N+1)$ are matched to segments defined by the knots so that the curve and N derivatives of the curve are smooth at each knot.

Thus, at step 288, the particular operating point is loaded which will control the output of the VCCS being analyzed. It will be recalled that the output of a VCCS is controlled by one term which is a function of voltages throughout the component being simulated and another term related to the time derivative of charge. The first component may be referred to as a DC component while the second component may be referred to as a capacitive component. Step 290 determines whether the particular VCCS being analyzed has a DC component. If so, then step 292 calls the SURFACE subroutine which takes the raw data collected in accordance with the procedure illustrated in FIGS. 2A and 2B and employs the spline function to create a surface from the raw data whose value can be analyzed at the particular control voltage specified in step 288. In a sense, this surface gives the value of current that will be produced by the VCCS with the particular control voltages specified.

If the particular VCCS being analyzed contains no DC component, the determination at step 290 is negative so that processing proceeds to step 294. At step 294, it is determined whether a DC analysis is being performed on the circuit under study. If it is a DC analysis being performed in accordance with the flow diagram of FIG. 3, then only the DC component of the particular VCCS being analyzed need be determined and that has been performed already at step 292. Therefore, processing passes to step 296 at which convergence is checked. Currents in the various branches of the circuit being analyzed are not retained. Therefore, it is necessary at this point to check the branch currents at the device level. At step 298, the data indicating the output of the particular VCCS being analyzed is loaded into a matrix along with the output data from other sources being analyzed and also the right hand side of the particular circuit equation is also loaded. Those of ordinary skill in the art will realize that this is referring to the right hand side of the circuit equations that define the operation of the circuit and are related to the voltage/current sources in the circuit. Finally, at step 300, the next VCCS is identified.

When performing the DC analysis of FIG. 3, no capacitive or inductive data is necessary. However, such capacitive or inductive data is necessary for other types of analyses. Accordingly, if the determination at step 294 indicates that something other than a DC analysis is needed, step 302 determines whether the particular VCCS being analyzed has a capacitive component. If not, processing passes to step 296.

Should a capacitive component exist for the particular VCCS being analyzed as determined at step 302, step 304 causes the SURFACE subroutine to analyze the charge versus voltage data collected in accordance with the process of FIGS. 2A and 2B. The result of this analysis is an indication of the charge that will appear across specific points of the circuit being simulated at the particular voltages specified by the operating point loaded at step 288.

Step 306 determines whether a small signal analysis must be performed. If so, capacitive data is loaded at step 307 and processing proceeds to step 300.

If a small signal analysis is not required as determined by step 306, it is next determined whether a transient analysis is necessary at step 308. If transient analysis is not desired as determined at step 308, then no analysis is desired so that an error message is generated at step 310 and the subroutine is exited at step 312.

Should a transient analysis be desired as determined at step 308 a TIME INTERGRATION subroutine is called which determines values of the functions representing the particular VCCS at specific time points. The details of the TIME INTERGRATION subroutine are not illustrated since they are well known to those of ordinary skill in the art. Processing then proceeds to step 296.

Figure 9:
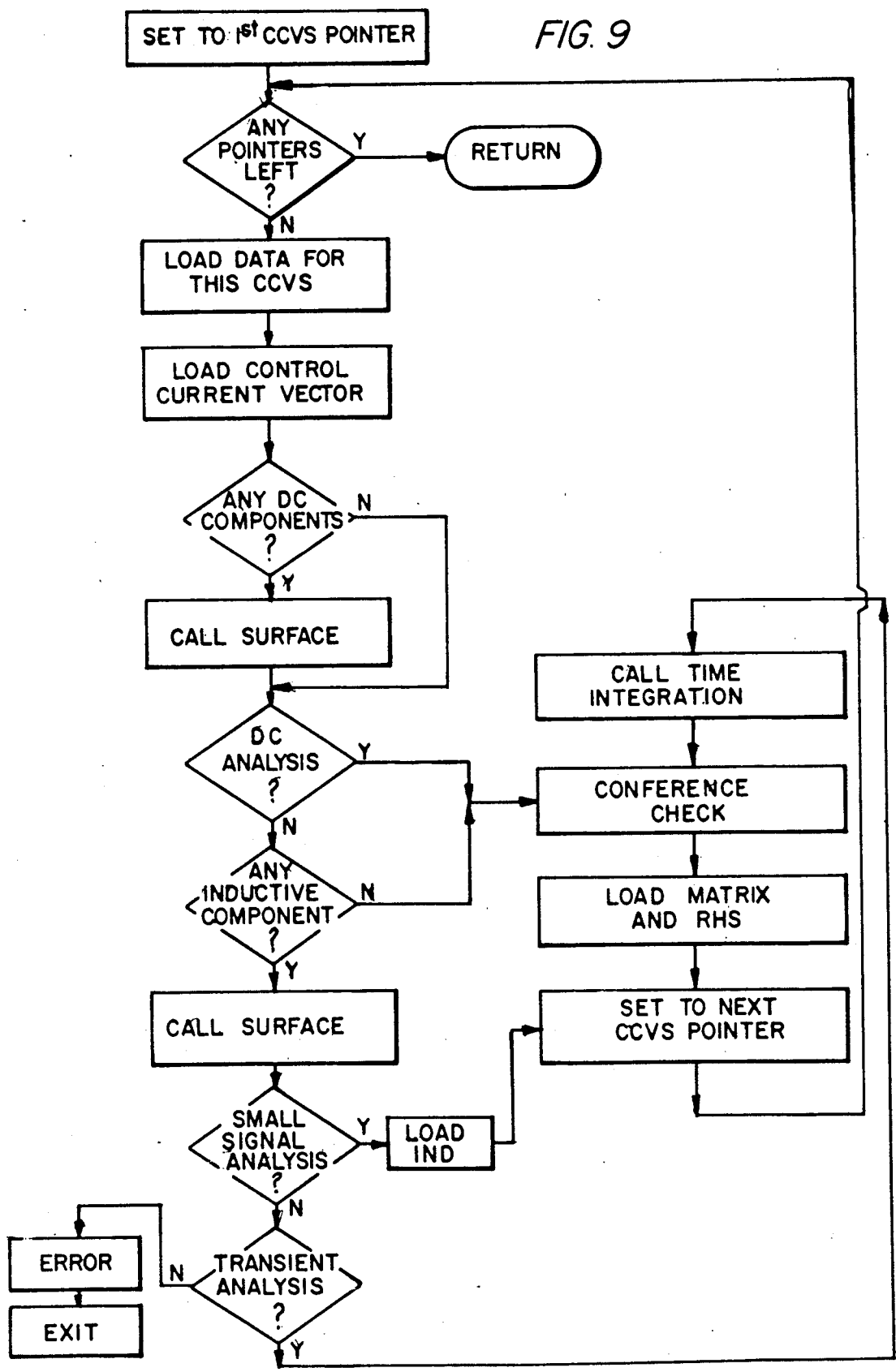

FIG. 9 illustrates the processing necessary when the CCVS subroutine is called at step 268 in FIG. 7. It can be seen that the CCVS subroutine of FIG. 9 is identical to VCCS subroutine of FIG. 8 but for the fundamental differences between a current controlled voltage source and a voltage controlled current source. Whereas a voltage controlled source produces a current related to a function of voltage and related to a time derivative of charge, a current controlled voltage source produces a voltage which has a component which is a function of current and a component which is a function of the time derivative of flux. Thus, the only differences between the CCVS subroutine of FIG. 9 and the VCCS subroutine of FIG. 8 are that a controlled current vector is loaded at step 288 instead of a voltage vector, the existence of any inductive components is determined instead of determining the existence of capacitive components as at step 302 and inductive data is loaded instead of capacitive data at step 308. Therefore, no further discussion of the routine of FIG. 9 is necessary.

Figure 10:
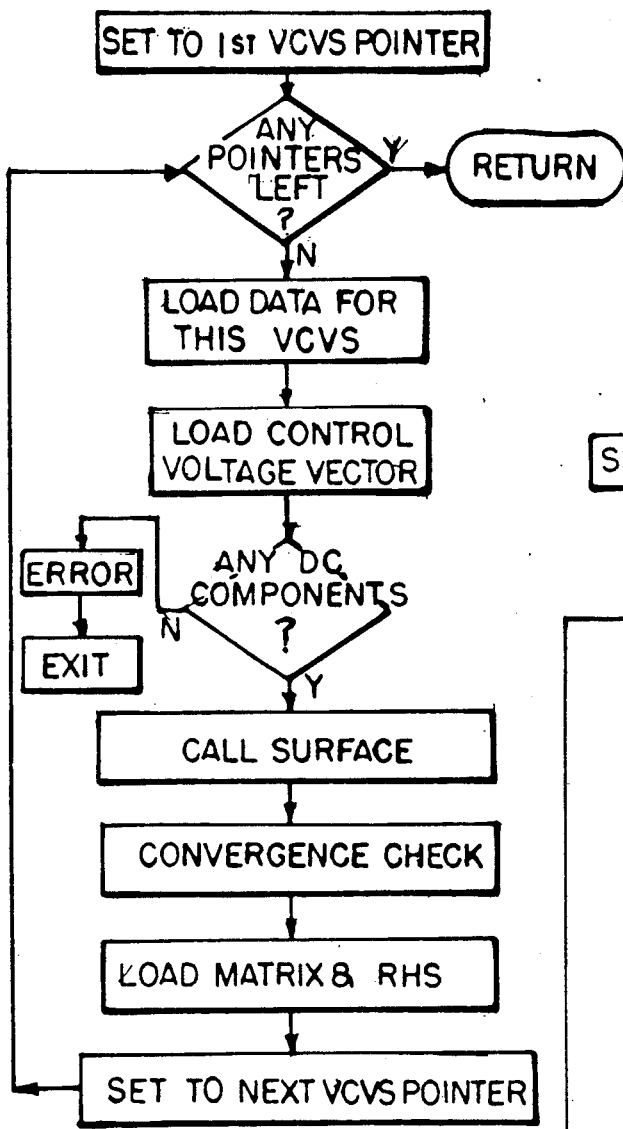

FIG. 10 shows the CCCS subroutine called at step 276 in FIG. 7. Recall that a current controlled current source has only a DC component which is function of current. Therefore, the CCCS subroutine of FIG. 10 is very similar to the CCVS subroutine of FIG. 9 except for the elimination of all portions of the CCVS subroutine of FIG. 9 relating to inductive components.

Figure 11:
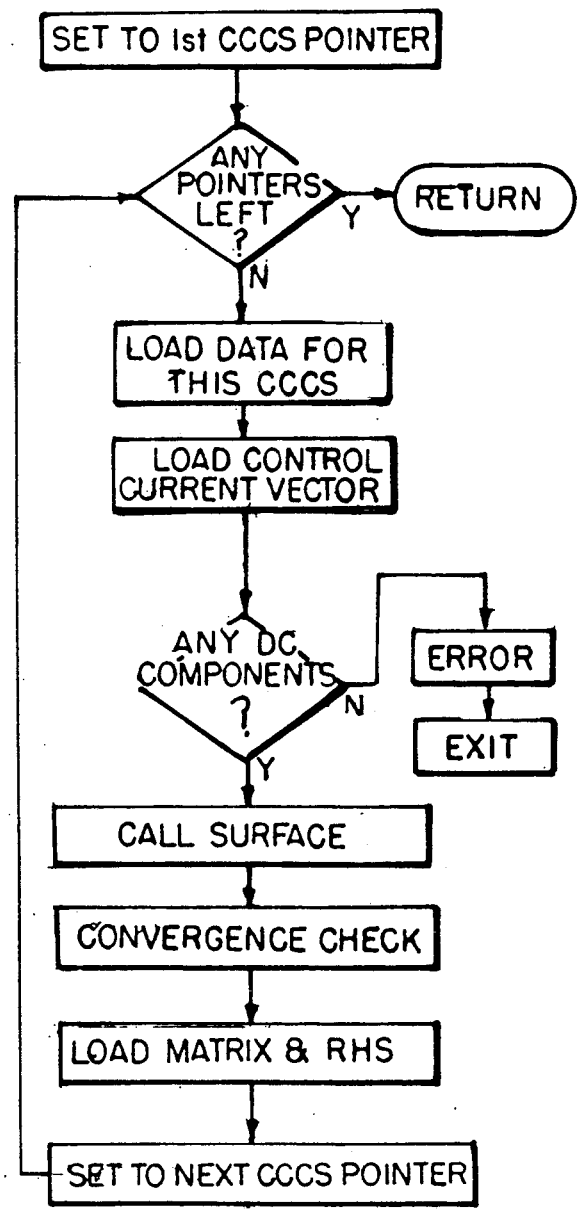

FIG. 11 illustrates the VCVS subroutine accessed at step 272 of FIG. 7. Again, a voltage controlled voltage source has no time dependent component, consisting only of a DC component related to voltage. Accordingly, the VCVS subroutine of FIG. 11 is identical to the CCCS subroutine of FIG. 10 except that a control voltage vector is loaded instead of a control current vector.

In view of the obvious similarities between the subroutines illustrated in FIGS. 8 through 11, no further discussion of these subroutines is necessary.

Figure 12:
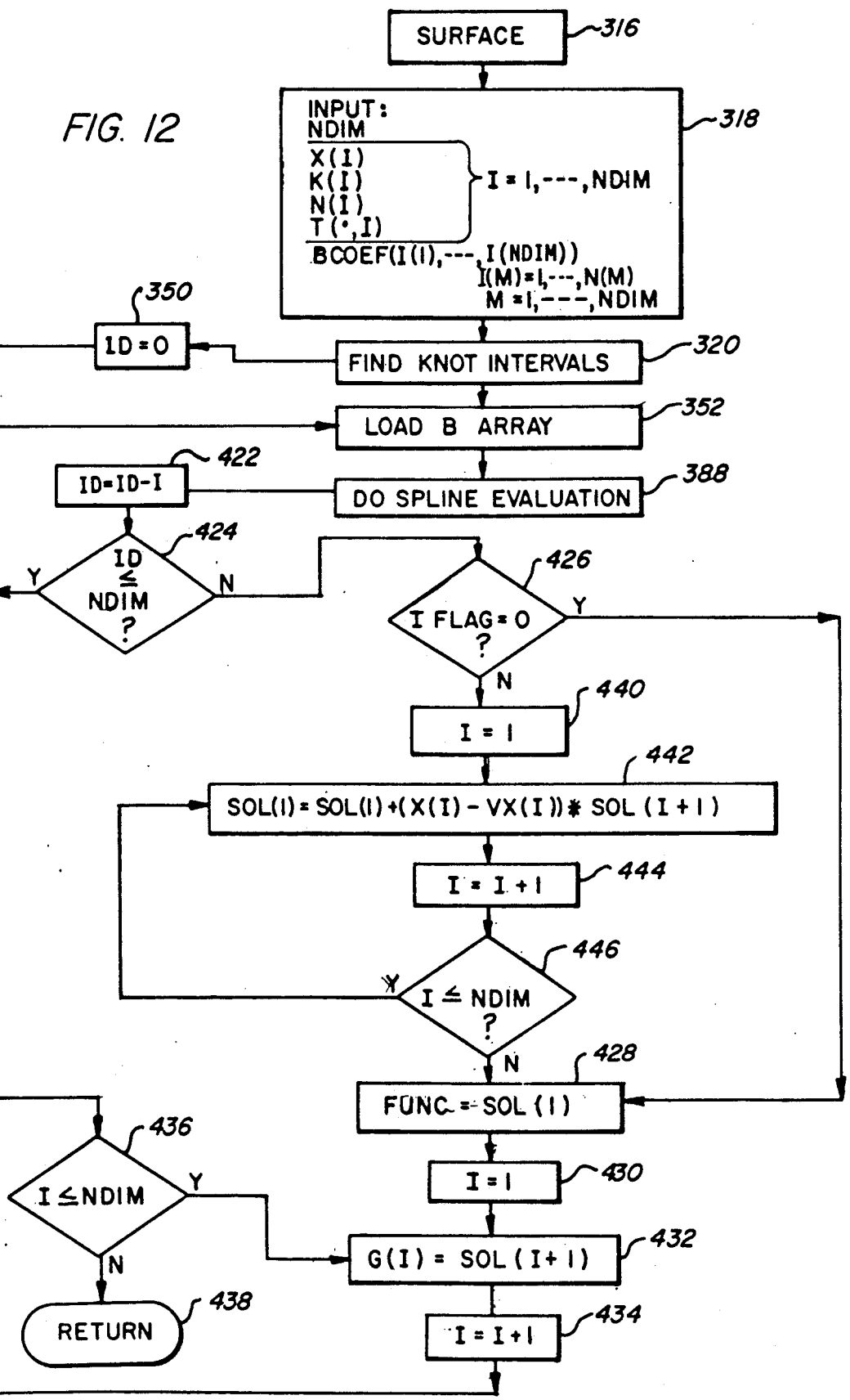
FIG. 12 is a flow diagram of a subroutine for forming a surface corresponding to data actually measured in the present invention.

Whenever the SURFACE subroutine is called from any of the subroutines of FIGS. 8 through 11 (see, for example, steps 292 and 304 of FIG. 8), processing proceeds to step 316 in FIG. 12. First, a set of data is collected so that spline functions may be employed to form a surface which may be evaluated at one particular point. That inputting occurs at step 318.

The body of data collected for each particular source may be organized in the form of a multidimensional matrix. Each dimension of the matrix represents one variable that influences the output of the particular source. That matrix is referred to as the BCOEF matrix whose value is dependent on a number, NDIM, of control variables where NDIM is the total number of control variables that influence the output of the particular source. Each of the control variables can have a number, N(I), of different values as measured in accordance with the procedures of FIGS. 2A and 2B. Thus, if the output of a particular source is influenced by four different control variables and each of the control variables could have five possible values, then the BCOEF matrix would include $5^4$ possible values for the output of the particular source being analyzed.

Spline functions are used in the preferred embodiment to form a surface with the data points that have been measured. Evaluation of the spline function obviously requires the BCOEF matrix as has been discussed above. Furthermore, the spline function needs the value of each control variable, X(I), as specified by the particular operating point at which the BCOEF matrix is to be analyzed. Also, those of ordinary skill in the art will realize that the order of the spline analysis must be identified for each control variable and this order is referred to as K(I). As has been described above, the spline function also requires the number of sample points that were measured in the $I^{th}$ dimension, referred to as N(I).

The last bit of information necessary to execute a spline function is the T array or knot array which defines where reference points are set for each possible dimension. The first argument of the array indicates which reference point is being referred to for a particular dimension and the second argument refers to the dimension itself.

Figure 13:
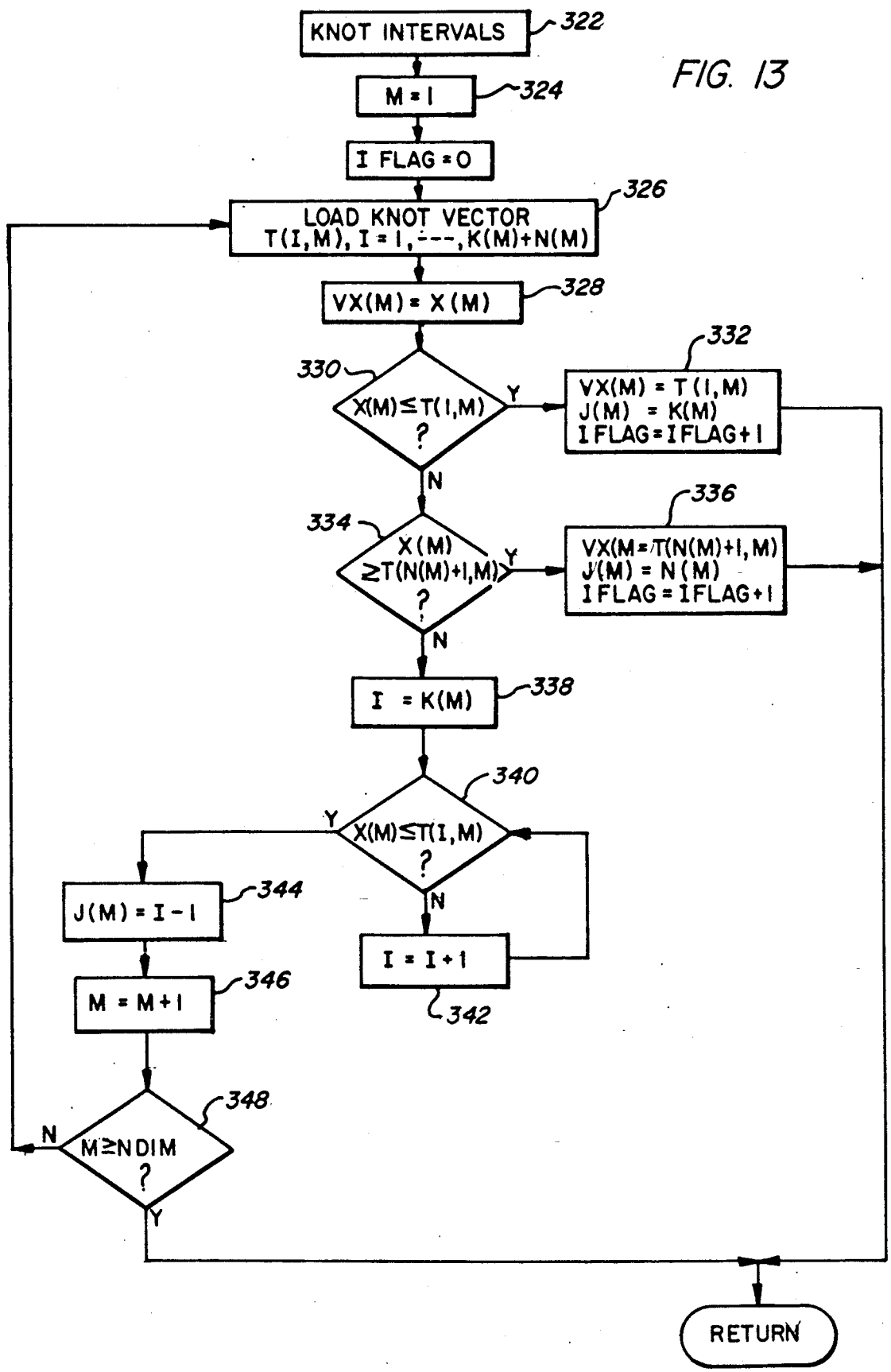
FIG. 13 is a flow diagram illustrating the manner in which knot intervals are found for the surface subroutine.

After inputting all the necessary data at step 318, processing passes to step 320 in which the KNOT INTERVALS subroutine is executed as illustrated in FIG. 13. The purpose of this subroutine is to determine for each control variable or dimension which knots are closest to that particular control variable value. Those of ordinary skill in the art will realize that in order to perform a spline function, it is necessary to employ the value of the function at each of the K−1 measurements taken before the control variable and 1 measurement taken after the control variable to determine the value of the function at the particular control variable value (recall that K is the spline order for any particular dimension). For a particular source which has a number of control variables controlling its output, it is necessary to obtain the K−1 measurements taken before and 1 measurement taken after the actual control variable value being processed for each of the control variables so that the spline function may be employed to interpolate at the control variable values over the various dimensions. To accomplish this, the KNOT INTERVALS subroutine is designed to select the particular knot (related to the particular measurement) which occurs just before the actual control variable value that forms a part of the operating point being analyzed.

Figure 14:
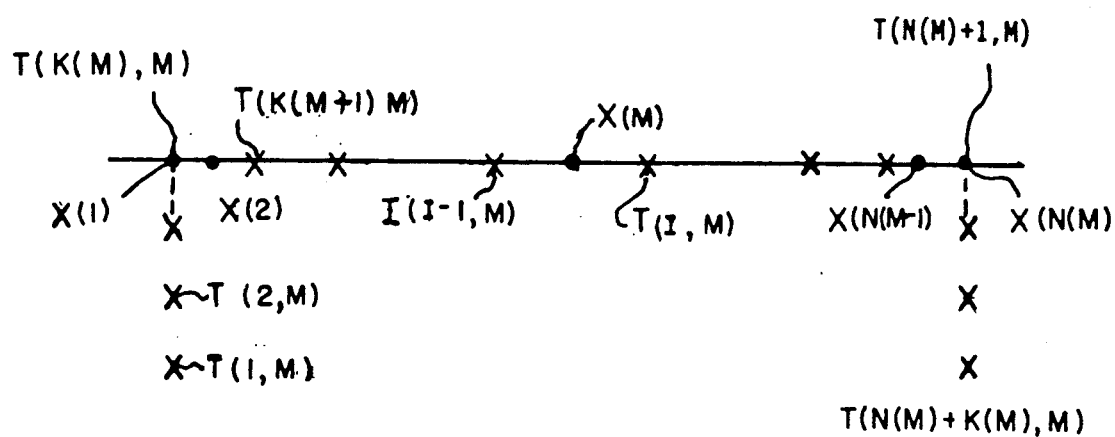
FIG. 14 is a graphic illustration of knots employed with spline functions.

To understand the concept of knots and the relation of knots to measurements taken, the diagram of FIG. 14 may be helpful. FIG. 14 illustrates the relationship of knots to the control variable value being analyzed for the one particular axis of the matrix representing that particular control variable (control variable M). Knots are located over the entire range which the control variable X(M) can vary. However, in order to interpolate function values at the beginning and end of that range, it is necessary that K knots are positioned at the same location at the beginning of the range and K knots are positioned at the same location at the end of the range. For each dimension, a total of N(M)+K(M) knots are employed for dimension M where N is the number of data sample points collected during the process of FIGS. 2A and 2B for dimension M and K is the spline order of dimension M. The first measured value for control variable M is defined to be T(K(M),M) and the knots are selected so that the second measured value for control variable M falls between knots K(M) and K(M)+1. Thereafter one measurement falls between successive pairs of knots. The last measurement occurs at the knot value T(N(M)+1,M).

Turning now to FIG. 13, after the knot INTERVALS subroutine begins at step 322, a counter M is initialized to 1 at step 324. Each dimension is processed in turn and the counter M maintains a count of the dimension presently being processed. At step 326, a knot vector is loaded for the particular dimension being processed. At step 328, a variable VX(M) is set equal to the value of the control variable being analyzed for that particular dimension. The variable VX will retain the value of the control variable unless the control variable is found to have a value before the first knot or after the last knot as will be described in more detail below.

Processing then passes to step 330 which determines whether the control variable for that dimension actually has a value less than the value of the first knot of that dimension. If the determination at step 330 is positive, step 332 sets the value VX(M) equal to the position of the first knot, sets the value J(M) equal to the knot order for that dimension and sets IFLAG, indicating that interpolation must occur because the control variable value is outside of the range of knots. Processing then returns to step 320 of FIG. 12.

If step 330 of FIG. 13 determines that the control variable value is greater than the first knot value then processing passes to step 334 to determine whether the control variable value is greater than the highest knot value. If the determination is positive, it means that the control variable is beyond the other end of range of knot values. If so, the variable VX(M) is set equal to the highest knot value for that dimension, the pointer J(M) is set equal to the number of samples that were taken for that dimension and IFLAG is set, indicating that interpolation is necessary at the other end of the knot range. Processing returns to step 320 in FIG. 12.

If the value of the control variable is between the values of the highest and lowest knot values then a variable I is set equal to the knot value for that dimension at step 338. Step 340 then determines whether the control variable value is less than or equal the $I^{th}$ knot value in dimension M. As long as the knot value remains below the value of the control variable, the value of I continues to be incremented at step 342. Once the knot value does exceed the control variable value, the pointer J(M) is set to indicate the knot just before the location of the control variable value. The dimension counter M is incremented at step 346 and step 348 causes the processing of steps 326 through 348 to be repeated for each dimension until the pointer J and the variable VX have been set for each dimension. Then, the determination at step 348 is positive causing programming to return to step 320 in FIG. 12.

As is well known by those of ordinary skill in the art, in order to perform the evaluation of FIG. 4, it is necessary to obtain the surface of the function being processed in addition to the derivative of the surface with respect to each of the control variables. The preferred embodiment of this invention determines these values with a spline evaluation. The variable ID maintains track of which control variable will have its derivate taken at any particular time. When ID is zero, simply the surface will be calculated. When ID is one, the derivative of the surface with respect to the first control variable is derived. When ID is two, the derivative of the surface with respect to the second control variable is derived, and so on.

After step 350, the LOAD B ARRAY subroutine is executed at step 352. This subroutine is illustrated in more detail in FIG. 15. The loading of this B array occurs to transform the BCOEF matrix with all of the measured function values into a scalar array in an order that is particularly useful for using spline functions. That array is referred to as the B array. Keep in mind that all the data that is necessary to perform the spline evaluation is the value of the function at K−1 measurements before the actual value of the control variable and one measurement after the actual value of the control variable (K being the spline order for the particular dimension). In view of the relationship of knots to measurements described above with respect to FIG. 14, the spline evaluation requires the measurements from $J(M)-K(M)+1$ to $J(M)$ for each dimension M.

Figure 15:
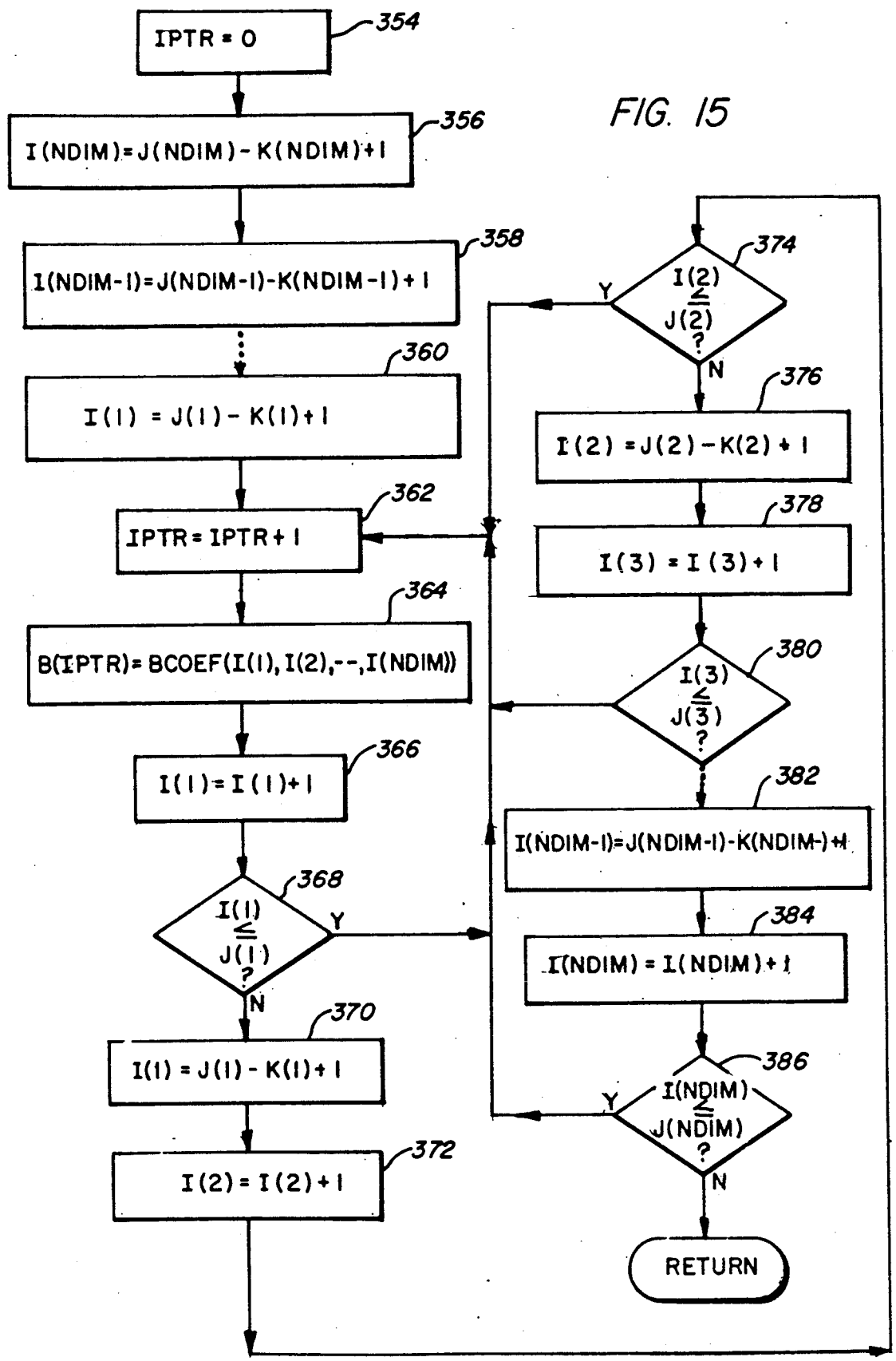
FIG. 15 is a flow diagram of the manner in which an array of measured variables is loaded in a matrix.

To this end, at step 354 in FIG. 15, a counter IPTR is set to zero. The value of IPTR represents a particular location in the B array that is being loaded during this subroutine. At steps 356 through 360, a variable I(M) for each of the NDIM dimensions is loaded with a measurement value which is K−1 measurements before the control value for that particular dimension. At step 362, the counter IPTR is incremented and the value of the BCOEF matrix with all control variables at the K−1 number of measurement points before the value of the control variable is obtained. This value of BCOEF is loaded into the first position of the B array. The measurement point of the first control variable is incremented by one at step 366 and then checked to see whether the new measure point is more than one beyond the actual control value at step 368. Steps 362 through 368 are repeated until the B array has been loaded with the values of the BCOEF matrix corresponding to K−1 measurement points before and one measurement point after the first control variable value with all other control variables being held to measurement values K−1 measurements before the actual control variable values.

Then, the first control variable is returned to the measurement value K−1 before the actual control value and the second control variables is incremented by one. Step 374 determines that the second control variable is not more than the measurement one greater than the actual second control value at step 374 and processing of steps 362 through 374 continues until the second control variable measurement just greater than the controlled value has been processed. With each pass, IPTR is incremented at step 362 and the B array is loaded with an additional appropriate value in step 364. This process continues through steps 376, 378, 380, 382, 384 and 386 until the B array is loaded with K measurements in each of NDIM dimension with the K−1 measurements before the actual value of the control variable for that dimension to one measurement value beyond the control value. Once step 386 determines that the entire B array has been loaded, processing returns to step 352 in FIG. 12.

Figure 16:
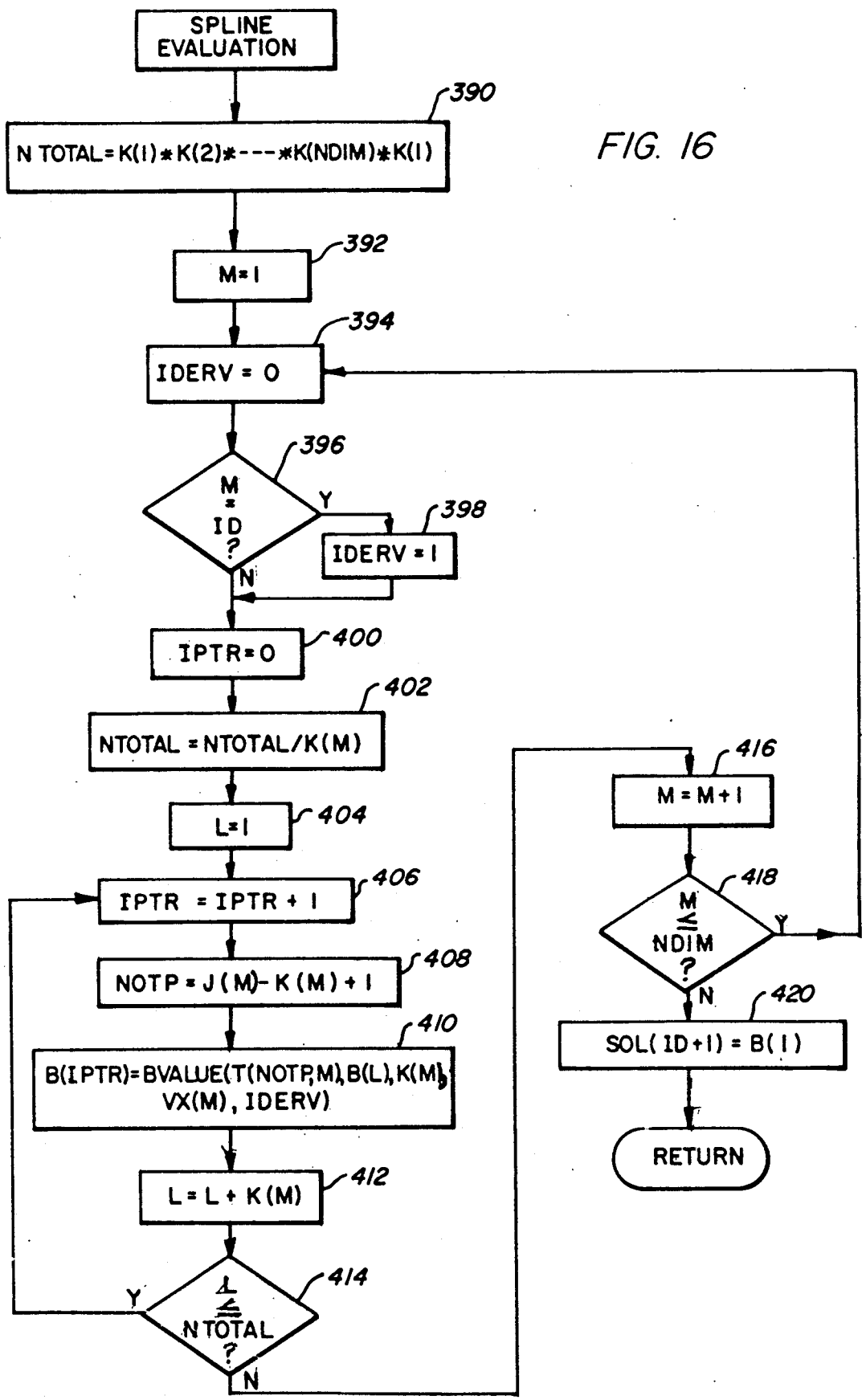
FIG. 16 is a flow diagram of the manner in which a spline function may be evaluated.

After step 352, processing proceeds to step 388 in FIG. 12 in which the SPLINE EVALUATION subroutine is performed in which the value of the function itself and the derivative of the function with respect to each control variable is obtained at the particular control variable values. Turning now to FIG. 16 which illustrates in greater detail the SPLINE EVALUATION subroutine, a variable NTOTAL is loaded with the total number of values in the B array times K(1) in step 390. As will be explained in detail below with respect to step 402, the spline order for the first variable, K(1) will be divided from NTOTAL before anything serious is done with the value NTOTAL. Therefore, NTOTAL can be thought of as the total number of entries in the B array.

Processing of the spline function must occur one dimension at a time so that at step 392, the first dimension is selected. At step 394, a flag IDERV is set to zero. As will be explained in detail below with respect to step 410, if IDERV is zero, then the actual value of the function will be determined whereas if IDERV is one, the derivative of the function with respect to that particular control variable or dimension will be determined. At step 396, it is determined whether the dimension equals the present value of ID. The first pass through, ID is set to zero at step 350 in FIG. 12 whereas the first dimension is being considered. Therefore, the determination during the first pass is negative. However, as will be explained below with respect to steps 422 and 424 in FIG. 12, the value of ID is incremented after all dimensions have been processed with ID equal to zero. When the value of M does equal ID, the IDERV flag is set at step 398 so that the derivative of the function with respect to that dimension will be determined at step 410.

At step 400, the value IPTR is set to zero. As will be recalled with respect to steps 354, 362 and 364 in FIG. 15, IPTR refers to a particular position in the B array. At step 402, NTOTAL is divided by the spline order for the particular dimension being processed and the new value is placed in NTOTAL. The first pass through causes the spline order for the first dimension to be divided from NTOTAL so that NTOTAL represents the total number of values in the B array. At step 404, a counter L is initialized to one.

Then, a loop is entered including steps 406 through 414. In this loop, old values in the B array are processed in accordance with the spline function and the newly calculated values are reinserted in the B array for further calculation. At step 406, the counter IPTR is incremented by one and at step 408, a variable NOTP is set with the number of the knot which is K−1 knots before the position of the actual control variable value for the dimension being processed.

At step 410, BVALUE is the actual spline function. This function produces a value based upon the next K(M) values of the knot array beginning with the K−1 knot before the actual control value, the next K(M) values of the B array in the order loaded in the subroutine of FIG. 15, the spline order value for that particular dimension, the value of VX for that dimension as determined in steps 328, 332 and 336 in FIG. 13 and the value of the flag IDERV which will determine whether the value of the function or the value of the derivative of the function will be obtained for the particular dimension being processed as determined by steps 394 through 398. The spline function will use K(M) values of the B array each time the spline function is calculated and will load the answer into one location the B array. Spline mathematics is well known to those of ordinary skill in the art.

At step 412, the variable L is incremented by the spline order number for the particular dimension being processed. This will cause step 410 to take the next K(M) values from the B array during the next pass through steps 406 through 414. At step 414, looping back to 406 continues until the entire B array has been processed and reloaded with new values at step 410. After this has occurred, processing passes to step 416 where the dimension being processed is incremented by one and step 418 then checks to see whether all dimensions have been processed. If all dimensions have not been processed, step 394 et seq. are executed. Note that as a result of step 410, the number of entries in the B array has been reduced by a factor of K(M). That is, step 410 takes groups of K(M) values from the B array and replaces the K(M) values with a single value. Thus, with NTOTAL being divided by K(M) with each pass by step 402, NTOTAL continues to provide an indication of the total number of entries in the most recently updated version of the B array. Once step 418 determines that all dimensions have been processed for a particular value of ID, the result is a single number located in the B array at B(1). This single number is loaded in step 420 into a variable SOL(ID+1) where SOL(1) is the value of the function itself at the control values and SOL(I+1) represents the value of the derivative of the function with respect to the control variable X(I) at the control values. Thus, with ID equal to zero, the value in the B array at B(1) represents the value of the function itself as defined by the body of data collected for the particular source in accordance with FIG. 2A and 2B at the appropriate operating point defined by the control values. Processing then returns to step 388 in FIG. 12.

After step 388, the variable ID is incremented by 1 in step 422 and step 424 checks whether the derivative of the function has been determined for all of the control variables. The B array is reloaded at step 352 and spline evaluation occurs at step 388 until the derivative with respect to all the control variables has been determined. Thus, on the second pass through steps 352 and 388, ID will be one. This means that the final answer obtained in step 420 of FIG. 16 will be the value of the derivative of the function with respect to the first control variable at the specified control values. Steps 422 and 424 cause this process to proceed until the array SOL is loaded with the value of the function itself and the value of the derivatives of the function with respect to all control variables.

When step 424 determines that the derivative of the function has been determined with respect to all of the control variables, the determination at step 424 is negative so that processing passes to step 426. At step 426, it is determined whether the IFLAG flag has been set or not. This flag is set when step 332 or 336 is executed and indicates that the control variable for at least one dimension is outside of the range of knot values that have been specified. This indicates that linear extrapolation is necessary. However, if the IFLAG flag has not been set (is equal to zero), it means that all control variables are within the range of knot values for each particular dimension. Therefore, processing passes to step 428 where a value FUNC is loaded with the actual value of the function itself at the operating points specified by the control variables. In steps 430 through 436, an array G is loaded with the values of the derivative of the function with respect to each of the control variables. The array G represents the conductances for the circuit equations as would be well known to those of ordinary skill in the art. Once the array G is fully loaded, the SURFACE subroutine ends at step 438.

If the flag IFLAG had been set for any dimension in step 332 or 336 in FIG. 13, it is necessary to extrapolate to find the value of the function at the actual operating point specified by the control values. Since steps 332 and 336 set the value VX equal to the extreme knot values, step 410 in FIG. 16 has determined the value of the function at the extreme knot value. It is then necessary to extrapolate from the value of the function at the extreme knot value to the value of the function at the actual operating point determined by the control values. This is accomplished at step 442 in FIG. 12 by adding the value of the function at the extreme knot value to the slope of the function at the knot value for that particular control variable times the distance between that particular control variable and the value VX. Recall that variable VX is usually the same as X except when X is beyond the extreme knot values. This extrapolation must be performed in every dimension. Therefore, a variable I is initialized in step 440 and steps 440 and 446 cause the extrapolation of step 442 to continue until all dimensions have been processed.

Although only a single exemplary embodiment of this invention has been described in detail above, those skilled in the art will readily appreciate that many modifications are possible in the preferred embodiment without materially departing from the novelty teachings and advantages of this invention.

For example, it is possible to evaluate the function defined by the values measured in accordance with FIGS. 2A and 2B at the particular operating points specified by the control values other than with spline functions. Also, the operating point may be determined by an algorithm other than the Newton-Rhapson iterative technique. All such modifications are intended to be included within the scope of this invention as defined by the following claims.

What is claimed is:

1. A method of simulating operation of a circuit having a plurality of circuit components, at least one of which is an active component, comprising the steps of:
    loading characterizing data having been previously actually measured for an actual sample of each individual one of said circuit components, including said at least one active component, in a memory connected to processing means;
    loading into said memory data specifying interconnections of said circuit components, including said at least one active component, to form said circuit being simulated; and
    causing said processing means to accept said data from both said loading steps and mathematically analyzing the operation of said circuit established in said interconnections loading step to determine operation of said circuit formed by the cooperation of said components, whose characterizing data was loaded said characterizing data loading step, as interconnected in a manner specified in said interconnections loading step by mathematically analyzing interactions of said circuit components.

2. A method as in claim 1 wherein said characterizing data loading step includes the steps of:
    characterizing each said circuit component as at least one of a voltage controlled voltage source, a voltage controlled current source, a current controlled voltage source and a current controlled current source; and
    loading voltage or current data for said sources corresponding to each said circuit component by measuring and storing voltage and current data for actual samples of each said circuit component.

3. A method as in claim 1 wherein said characterizing data loading step includes the step of storing capacitance or inductance data for at least one said circuit component.

4. A method as in claim 1 wherein said causing step includes the steps of:
  causing said processing means to select a trial operating point for said circuit; and
  causing said processing means to employ spline equations for determining data values between values of data actually loaded during said characterizing data loading step and linearizing data from said characterizing data loading step around said operating point.

5. A method as in claim 1 further comprising the step of repeating both said loading steps, and said causing step for a series of values of sources in said circuit to perform a DC sweep analysis.

6. A method as in claim 1 further comprising the steps of:
  causing said processing means to discretize differential equations in time; and
  repeating both said loading steps and said causing step at each incremental time to perform a transient analysis of said circuit.

7. A method as in claim 6 further comprising the step of spectrum analyzing the results of said transient analysis to perform an AC analysis.

8. A method of simulating operation of a circuit having a plurality of circuit components, at least one of which is an active component, comprising the steps of:
  (a) characterizing each of said circuit components as at least one of a voltage controlled voltage source, a voltage controlled current source, a current controlled voltage source and a current controlled current source;
  (b) loading voltage or current data for said sources corresponding to each of said circuit components by loading voltage and current data having been previously measured for an actual sample of each individual one of said circuit components, including said at least one active component, in a memory connected to processing means;
  (c) loading capacitance or inductance data for at least one of said circuit components in said memory;
  (d) loading into said memory data specifying interconnections of said circuit components, including said at least one active component, to form said circuit being simulated;
  (e) causing said processing means to select a trial operating point for said circuit formed by the cooperation of said components, whose characterizing data was loaded in said loading steps (b) and (c), as interconnected in a manner specified in said loading step (d);
  (f) causing said processing means to interpolate data from all of said loading steps around said operating point;
  (g) causing said processing means to create linearized circuit equations for said circuit using said interpolated data;
  (h) causing said processing means to solve said linearized equations; and
  (i) repeating said steps (e) through (h) with other trial operating points until said step (h) produces a solution within a predetermined range to determine operation of said circuit.

9. A method as in claim 8 wherein said repeating step includes the step of causing said processing means to utilize a Newton-Rhapson technique for selecting values for said other trial operating points which produce solutions iteratively closer to said predetermined range.

10. A method as in claim 8 wherein said step f) includes the step of causing said processing means to employ spline functions to determine data values between values actually loaded in said loading step.

11. A method as in claim 10 wherein said repeating step further includes the step of causing said processing means to employ a Newton-Rhapson technique for selecting values for said other trial operating points which produce solutions iteratively closer to said predetermined range.

12. A method as in claim 8 further comprising the step of repeating said steps (a) through (i) for a series of values of sources of said circuit to perform a DC sweep analysis.

13. A method as in claim 8 further comprising the steps of:
  causing said processing means to discretize differential circuit equations in time; and
  repeating said steps (a) through (i) for a series of incremental times to perform a transient analysis.

14. A method as in claim 13 further comprising the step of spectrum analyzing said transient analysis to obtain an AC analysis.

15. A method of simulating operation of a circuit having a plurality of circuit components, at least one of which is an active component, comprising the steps of:
  measuring characteristic data for an actual sample of each individual one of said circuit components, including said at least one active component, by physically testing each said circuit component;
  loading into a memory connected to processing means data specifying interconnections of said circuit components, including said at least one active component, to form said circuit being simulated; and
  causing said processing means to accept said data from said measuring step and said data from said loading step and mathematically analyzing the operation of said circuit established in said interconnections loading step to determine operation of said circuit formed by the cooperation of said components, whose characterizing data was measured in said measuring step, as interconnected in a manner specified in said interconnections loading step by mathematically analyzing interactions between said circuit components.

16. A method as in claim 15 wherein said measuring step includes the steps of:
  characterizing each said circuit component as at least one of a voltage controlled voltage source, a voltage controlled current source, a current controlled voltage source and a current controlled current source; and
  measuring voltage or current data for said sources corresponding to each said circuit component by measuring voltage or current data for actual samples of each said circuit component.

17. A method as in claim 15 further comprising the step of measuring capacitance or inductance data for each said circuit component.

18. A method as in claim 15 wherein said causing step includes the steps of:

causing said processing means to select a trial operating point for said circuit;

causing said processing means to interpolate data from said measuring step around said operating points;

causing said processing means to create linearized circuit equations for said circuit using said interpolated data;

causing said processing means to solve said linearized equations; and repeating said selecting, interpolating, creating and solving steps with other trial operating points until said solving step produced a solution within a predetermined range.

19. A method as in claim 18 wherein said interpolating step causes said processing means to employ spline functions to evaluate said data between data values actually measured.

20. A method as in claim 19 wherein said repeating step includes the step of causing said processing means to employ a Newton-Rhapson technique for selecting values for said other trial operating points which produce solutions iteratively closer to said predetermined range.

21. A method of simulating operation of a circuit having a plurality of circuit components, at least one of which is an active component, comprising the steps of:
(a) characterizing each of said circuit components as at least one of a voltage controlled voltage source, a voltage controlled current source, a current controlled voltage source and a current controlled current source;
(b) measuring characteristic data for said sources corresponding to each of said circuit components by measuring at least one of voltage and current data for an actual sample of each individual one of said circuit components, including said at least one active component;
(c) measuring one of capacitance and inductance data for each of said circuit components;
(d) loading said data from said steps b) and c) into a memory connected to processing means;
(e) loading into said memory data specifying interconnections of said circuit components, including said at least one active component, to form said circuit being simulated;
(f) causing said processing means to select a trial operating point for said circuit formed by the cooperation of said components whose characterizing data was loaded in said step (d), as interconnected in a manner specified in said loading step (e);
(g) causing said processing means to interpolate data from both said measuring steps around said operating point;
(h) causing said processing means to create linearized circuit equations for said circuit using said interpolated data;
(i) causing said processing means to solve said linearized equations; and
(j) repeating said steps f) through i) with other trial operating points until said step i) produces a solution within a predetermined range to determine operation of said circuit.

22. A method as in claim 21 wherein said repeating step includes the step of causing said processing means to employ a Newton-Rhapson technique for selecting values for said other trial operating points which produce solutions iteratively closer to said predetermined range.

23. A methods as in claim 21 wherein said step g) causes said processing means to employ spline functions to evaluate said data between data values actually measured.

24. A method as in claim 23 wherein said repeating step includes the step of causing said processing means to employ a Newton-Rhapson technique for selecting values for said other trial operating points which produce solutions iteratively closer to said predetermined range.

* * * * *